(12) United States Patent
Morong

(10) Patent No.: US 9,369,052 B1
(45) Date of Patent: Jun. 14, 2016

(54) PLURAL COMMUTATED-ELEMENT DIRECT-CURRENT CURRENT TRANSFORMER

(71) Applicant: William Henry Morong, Paoli, PA (US)

(72) Inventor: William Henry Morong, Paoli, PA (US)

( * ) Notice: Subject to any disclaimer, the term of this patent is extended or adjusted under 35 U.S.C. 154(b) by 0 days.

(21) Appl. No.: 14/953,331

(22) Filed: Nov. 28, 2015

(51) Int. Cl.
| H02M 3/335 | (2006.01) |
| H02M 1/00 | (2006.01) |
| H01F 27/42 | (2006.01) |
| H01F 27/29 | (2006.01) |

(52) U.S. Cl.
CPC ............ *H02M 3/33546* (2013.01); *H01F 27/29* (2013.01); *H01F 27/427* (2013.01)

(58) Field of Classification Search
CPC ............ H02M 3/335; H02M 3/33507; H02M 3/33523; H02M 3/3353; H02M 3/33538; H02M 3/33553; H02M 3/33569; H02M 3/33576
USPC ................. 363/21.01; 361/268; 324/120, 127
See application file for complete search history.

(56) References Cited

U.S. PATENT DOCUMENTS

2012/0063055 A1*   3/2012   Morong .................. H01F 38/32
                                                         361/268

* cited by examiner

*Primary Examiner* — Timothy J Dole
*Assistant Examiner* — Sisay G Tiku

(57) ABSTRACT

The present invention provides a plural commutated-element direct-current current transformer (DCCT) that offers wide bandwidth together with freedom from transient disturbances caused by commutation. Plural commutated elements, each comprising a commutating switch and a current transformer each generate, responsive to a commutating signal, a current in a burden, each burden generating in turn a signal representing a DCCT input current. The commutating signal for each element is out of phase with such signals driving other commutated elements. Because of this phase difference, at any given time at least one commutated element is producing a signal free of transient disturbances from commutation. A selector switch, responsive to a selector signal out of phase with all commutating signals, connects to a DCCT output terminal only a burden signal representing the input current that is presently free of transient disturbances.

7 Claims, 7 Drawing Sheets

PLURAL COMMUTATED-ELEMENT DIRECT-CURRENT CURRENT TRANSFORMER

STATEMENT REGARDING FEDERALLY SPONSORED RESEARCH OR DEVELOPMENT

The present invention was not developed with the use of any Federal Funds, but was developed independently by the inventor.

BACKGROUND OF THE INVENTION

The AC current transformer has been well-known for many decades, and is used where alternating currents are to be measured. Current transformers are often used to provide galvanic isolation between the circuit being measured and measurement or control apparatus. However, if sufficient direct current or low frequency alternating current flows in the circuit being measured, an AC current transformer, by itself, may, due to current transformer core saturation, be unable to transform a replica of its input current to measurement or control apparatus.

This invention is one form of apparatus known as direct-current current transformers, or DCCT's. Many prior art DCCT's supplement an AC current transformer to provide DC response. One common method is exemplified by the AC/DC current probe of U.S. Pat. No. 7,309,980, wherein a Hall-effect transducer provides low frequency transformation. Such devices have proven useful, but are subject to thermal drift, and to stray magnetic fields and, may require de-gaussing. Another method is alternately to saturate and de-saturate a current transformer core to convert the DC magnetic flux therein into a transformable AC signal. This method is exemplified by the current probe of U.S. Pat. No. 6,885,183, which also exemplifies another much-used method, to wit, that of using a DC feedback winding to cancel the DC magnetic flux in the transformer core. Generally, the methods using DC feedback are either complex or have bandwidth limited to a few KHz. Numerous other methods, some very complex, have been employed to provide a direct-current current transformer, or DCCT. One prior art DCCT, a single commutated-element DCCT, that of U.S. Pat. No. 8,929,053 B2 is a simple open loop device, but suffers from sub-100 nS transient disturbances that may degrade its utility at high frequencies.

OBJECTS OF THE PRESENT INVENTION

A first object of the present invention is to provide current-transformer apparatus capable of transforming both alternating and direct input currents, or a mixture of both, to provide an output signal responsive thereto without generating sub-100 nS artifacts in its output. A further object of this invention is to provide such apparatus that is simple, and which may provide bandwidth of 10 MHz or higher. Yet another object of the present invention is to provide a DCCT that is substantially insensitive to stray magnetic fields and, which does not require degaussing.

DEFINITIONS

Bilaterally-conducting: For an electronic switch such as a MOSFET, the property of conducting, or being ON, when turned ON, for either polarity of applied voltage.

Bipolar-blocking: For an electronic switch such as a MOSFET, the property of remaining non-conducting, or OFF, when turned OFF, for either polarity of applied voltage.

Burden: For a current transformer, an electrical load, often a resistor, connected in circuit with a secondary winding of the current transformer, a signal from which, often a voltage, is responsive to current in a primary winding of the current transformer, and which often used to represent that current. The burden of a current transformer also performs the important function of presenting a low impedance load to the transformer to prevent dangerous high voltages from developing across its windings. In preventing high voltages, the burden also maintains low magnetic flux levels in the core of the current transformer to maintain accuracy.

Chopping frequency: Commutation frequency. In this invention, the frequency at which the current in one of its current transformers is periodically reversed to reset the magnetic flux of that transformer.

Commutated element: In this invention, a circuit block comprising at least one commutating switch operated at a commutating frequency and one current transformer. A single commutated element is the simplest apparatus that may, albeit with difficulties, function as a commutated-element DCCT. A commutated element can transform a DC current into an AC current. A commutated element may also comprise a second commutating switch, whereby it can transform an AC current back a DC current.

Commutation: In this invention, periodic reversal of the direction of current flow in a transformer winding to reset the magnetic flux of the transformer core. Commutation may be implemented by reversing current flow in a single winding or by periodically connecting oppositely poled magnetically coupled windings in circuit with a current or voltage source. Commutation may be used to produce an AC magnetic flux from a DC current or voltage, or vice-versa.

Commutating Switch: A switch used to reverse, or commutate, the direction of current flow in a winding. With a single winding, a commutating switch is usually a DPDT (double-pole double-throw) switch.

Current transformer: A transformer having a primary winding designed to be connected in series-circuit with a current to be measured, and a secondary winding designed to be burdened, or loaded, by a low impedance across which is developed a voltage proportional to the primary winding current to be measured. The secondary winding current equals the primary winding current divided by the transformer turns ratio. An imaginary resistance, equal to the burden resistance divided by the square of the turns ratio, is reflected to appear in the primary winding circuit. Unlike voltage transformers, which are customarily used to convey and transform AC voltages from one circuit to another, and which are customarily loaded with resistances larger than a short-circuit, current transformers are used to convey and transform AC currents from one circuit to another, and are customarily loaded with burdens as closely resembling a short-circuit as is practical. The ideal, and impractical, burden would be a short-circuit which was nonetheless capable of providing data for measurement and control purposes. Whereas circuits associated with voltage transformers often dissipate disastrous amounts of power when loaded with short-circuits, circuits associated with current transformers often dissipate disastrous amounts of power when the current transformer burden is a high impedance or an open circuit.

DCCT: A direct-current current-transformer, often comprising one or more AC current transformers, which alone cannot tranform DC, and supplemental components to form a composite apparatus capable of tranforming DC currents.

Differential signal: A signal wherein a single article of data is conveyed by one or more pairs of electrical conductors, wherein that data is represented by the difference of voltage between or of current in the conductors rather than by reference to an arbitrary common point such as well-known ground.

Galvanic isolation: The lack of a metallic or ionic electrical connection between electrical circuits.

Magnetic flux: The flow of magnetic lines responsive to a magneto-motive force (MMF). MMF can be produced by a flow of electrical current. In a current transformer, magnetic flux in a magnetically permeable core results from the application to the core of MMF produced by an electrical current in its windings. In a current transformer magnetic flux hopefully flows largely in its core.

Selector Switch: In this invention, a switch used to choose to connect one of a plurality of signals to a given circuit node. In a preferred embodiment of this invention, an SPDT (single-pole double-throw) switch.

Spectral composition: For a DCCT according to this invention, the presence or absence of DC, and any AC signals in the input current of, or in any output signal generated by the DCCT.

Voltage transformer: A transformer which, unlike a current transformer, is intended to be operated in circuit with with a significantly larger than infinitesimal load for the purposes of conveying, isolating, and conditioning data signal and power-bearing voltage waveforms from one circuit to another. The conveying function usually involves replication of voltage across one winding across another winding. The isolating function occurs as a result of a lack of electrical conduction between windings. An aspect of the conditioning function relies on a transformers ability to replicate in a winding, scaled, proportional replicas of the voltage across another winding in accordance with their turns ratios.

BRIEF SUMMARY OF THE PRESENT INVENTION

According to this invention, an input current flowing through plural commutated elements is transformed to provide a DCCT output representing the input current. In each commutated element, input current flows through a primary winding of a current transformer, and is commutated by a first switch to generate AC magnetic flux in the primary winding of a transformer, inducing an AC current into a secondary winding of each current transformer. Each secondary winding current flows through a current transformer burden resistor, or load, to develop a voltage representing the input current. The switching of the first switch inevitably superimposes into the current flowing in each burden, and upon the voltage developed across each burden, short transient disturbances which do not represent the input current. A selector switch is operated to connect, at any given time, to the DCCT output the voltage of a burden resistor associated with one of the plural commutated elements, which element is not at that time generating a transient disturbance. According to this invention, a second commutating switch may be interposed in series circuit with each secondary winding and with each burden resistor to commutate the secondary winding current into its burden resistor. Thus may be restored to each burden resistor current the spectral components necessary to permit that current, and each burden resistor voltage, to represent the spectral composition of the current flowing through the input terminals of the DCCT.

DETAILED DESCRIPTION OF THE DRAWINGS

Figure 1:
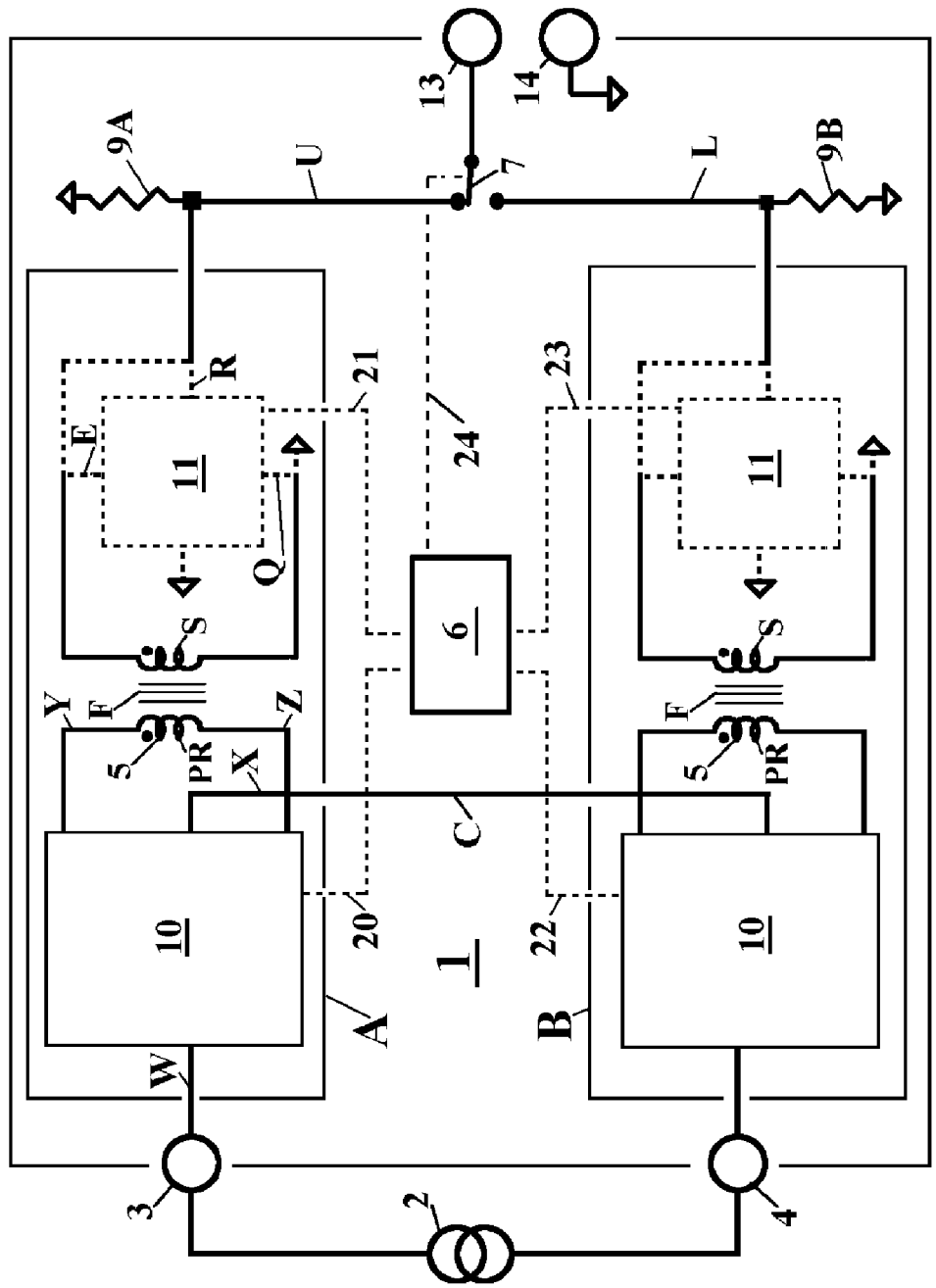
FIG. 1 shows a plural commutated-element DCCT according to the present invention.

FIG. 1 shows a plural commutated-element DCCT 1 according to the present invention comprising input terminals 3 and 4, two commutated elements A and B, two burden resistors 9A and 9B, a drive generator 6, a selector switch 7, and two output terminals 13 and 14. An input current to be measured from a source 2, of either polarity of DC, of AC, or a mixture of both, flows from through input terminal 3 through a line W, through first commutated element A, exits element A through a line X, thence is conducted through line C to flow in like manner though a second commutated element B whence the input current returns through terminal 4 to source 2.

Commutated elements A and B each comprise a switch 10 and a current transformer 5, each of the latter further comprising a primary winding PR, a secondary winding S, and a magnetic core F, and each optionally comprising a switch 11. The input current entering each switch 10 through its line W is conducted responsive to a commutation signal 20 for element A or signal 22 for element B, to enter through its line Y or its line Z the primary winding PR of transformer 5 of each element. Since commutation signals 20 and 22 are AC, if the input current is DC, the current flowing into the primary winding PR of each transformer 5 then becomes, in that winding, AC in phase with commutation signal 20 for commutated element A or signal 22 for element B. The AC current exiting the primary winding PR of each transformer 5 is also switched by switch 10, responsive to a commutation signal 20 or 22 of element A or B respectively, such that current having entered through line Y or Z exits that winding through line Z or Y respectively, thence to exit that switch 10 through its line X as DC current, thence to exit that element. This is the process of commutation whereby, within a commutated element, its primary winding PR is, in effect, periodically switched end-for-end in the path of the input current from source 2 to produce from a DC input current an AC current in the primary winding PR of a current transformer 5. In the absence such commutation by switch 10, transformer 5 might become incapable of transformer action for input currents comprising low-frequency or DC content because its core F might saturate.

The flow of AC current in the primary winding PR of each current transformer 5 induces into its secondary winding S an AC voltage. Each secondary winding S is connected, either directly or through a switch 11, in series circuit with either burden resistor, 9A for commutated element A or 9B for element B. Each such AC current flowing through burden resistor 9A or 9B develops across that resistor a voltage, on line U or L respectively, proportional to the input current from source 2, which voltage may be used to measure that input current or to control apparatus responsive thereto.

Each commutated element, A or B, of DCCT 1 could be used alone as a commutated DCCT according to prior art, but such use incurs a problem. Even using switches comprising modern MOSFET's it is impossible to commutate currents instantaneously, there necessarily being a time of a few nanoseconds to a few tens of nanoseconds when the switches will be in an indeterminate state. This transition time generates short transient disturbances in the output signal of a single commutated-element DCCT. For some applications, especially those where the input current to be measured is less than 1 MHz, simple filtration of a prior art single commutated-element DCCT may suffice to suppress such transient disturbances. However, since the bandwidth of a commutated-element DCCT may easily range from DC to well over 10 MHz, such filtration may seriously limit bandwidth and may introduce undesirable phase shifts between input current and output voltage, which degradations may be totally unacceptable for higher frequency applications. The plural commutated element A and B structure of the present invention solves this problem as will be described next.

By operating, for example, two commutated elements, such as elements A and B of the present invention, sufficiently out of phase with each other, one can assure that while one commutated element is generating transient disturbances, the other is generating a clean signal free of such artifacts. By using a selector switch 7 to connect to output terminal 13 only a signal on line U or L that presently clean, one can obtain at terminal 13, a continuous and disturbance-free representation of input current from source 2. Accordingly, selector switch 7 connects either the voltage of upper burden resistor 9A through line U, or of lower burden resistor 9B through line L, to terminal 13, responsive to selector signal 24. Most of the time, both such voltages are clean. During such a clean time selector signal 24 causes selector switch 7 to disconnect terminal 13 from, for example, burden resistor 9B voltage L that is about to be disturbed by commutated element switching, and to connect it to voltage U which is not about to be disturbed, until the transient disturbance has passed. After the passage of the transient disturbance and during a later clean period, selector switch 7 responsive to selector signal 24, reverses that selection to avoid the transient disturbance from the commutated element that was just clean but that is about to be switched.

In a preferred embodiment shown below signals 20 and 22 are out of phase by 90 degrees, an easily generated phase difference, though other phase differences can be used to practice this invention. A drive generator 6 provides a set of out-of-phase commutation signals 20 and 22, for DPDT switches 10 of commutated elements A and B respectively, a selector signal 24 to operate SPDT selector switch 7 to choose the clean commutated element output as explained above as will be explained and also shown in timing diagrams below, and optionally a galvanically isolated but synchronous set of commutation signals 21 and 23 for optional switches 11 of commutated elements A and B respectively. Selector signal 24 is preferably twice the frequency of the previously mentioned commutation signals, and is preferably 45 degrees out of phase with them all. It is important to note that though SPDT selector switch 7 alternately connects lines U and L to terminal 13, it never disconnects either commutated element A or B from its burden resistor 9A or 9B. This is because the secondary windings of classical current transformers, and likewise the secondary windings S of commutated elements A and B, must never be disconnected from their burden resistors during operation, lest a disaster occur.

For a DC input current, the output voltage at terminal 13 may be AC or DC, depending on whether one chooses to include switches 11. If no switches 11 are included, the dotted end of each transformer 5 secondary winding is connected directly in series circuit with its associated burden resistor 9A or 9B, and an AC output appears on output terminal 13. If switches 11 are included, the dotted end of each transformer 5 secondary winding S is connected to line E of its associated switch 11, and each undotted end is connected to line Q of its associated switch 11. Each line R is then connected to its associated burden resistor, and the circuit through the burden resistor is completed through the common line. In this case, each switch 11, responsive to signal 21 for element A and signal 23 for element B, commutates the AC current flowing through its associated secondary winding into a DC current in its associated burden resistor 9A or 9B respectively. With switches 11 implemented, for a DC input current from source 2, a DC voltage appears at output terminal 13. Whether or not optional switches 11 are implemented, as is true for classical AC current-transformers, the current transformer 5 of this invention should be connected in circuit with burdens of low resistance. With switches 11 implemented, one signal could be used in each of commutated elements A or B for both switch 10 primary winding PR commutation and switch 11 secondary winding S commutation save that, as in a classical current transformer, galvanic isolation is usually desired in the DCCT of the present invention. Galvanic isolation necessitates the separation of commutation signals 20 and 22 from signals 21 and 23 respectively.

The chopping frequency of this DCCT is the frequency of signals 20-23, also called the commutation frequency.

Figure 2:
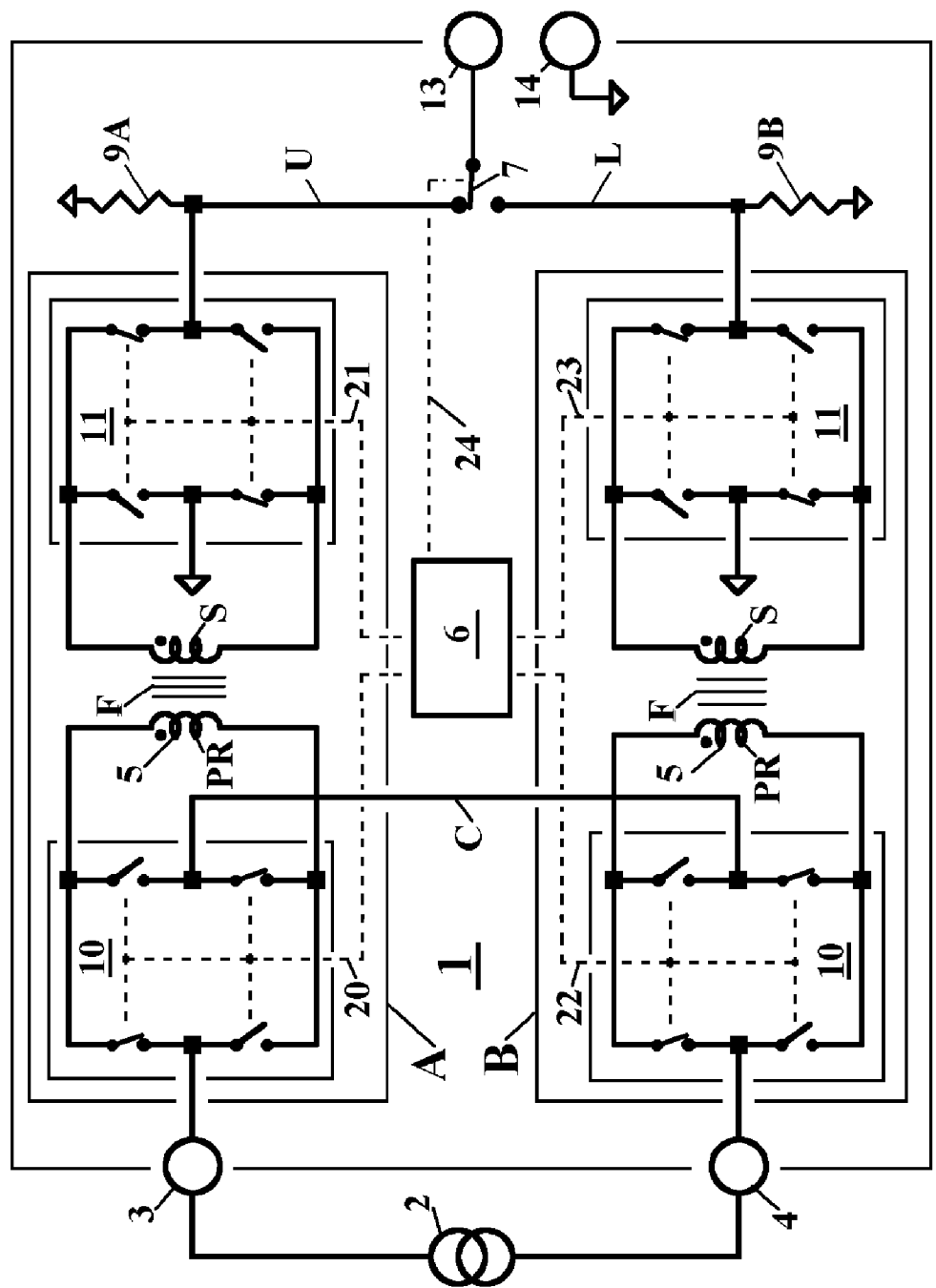
FIG. 2 shows a preferred embodiment of a plural commutated-element DCCT according to the present invention.

In principle, more than two commutated elements could be used to practice this invention FIG. 2 shows a preferred embodiment comprising commutated elements A and B each comprising a bridge-connected DPDT (double-pole double-throw) switch 10, a current transformer 5, and a DPDT commutating switch 11. Each current transformer 5 comprises a primary winding P, a secondary winding S, and a magnetic core F. Each switch 10 is connected in series circuit with the primary winding PR of its associated transformer 5. Each switch 10 commutates the input current from source 2 flowing through it associated primary winding P, responsive to a commutation signal 20 for commutated element A or signal 22 for commutated element B. The commutation of each DPDT switch 10 can convert a DC input current from source 2 to an AC current in the primary winding PR of each transformer 5, which induces into its secondary winding S an AC current equal to the input current from source 2 divided by the its turns ratio.

Each commutating switch 11 is connected in series circuit with a secondary winding S of its transformer 5 and with its associated burden resistor, either 9A or 9B, through which circuit current induced into its secondary winding S flows. If the current from source 2 is DC, the simultaneous commutation of each transformer 5 secondary winding S current by its DPDT switch 11 converts its AC secondary winding S current into DC current through its burden resistor, either 9A or 9B, said DC current being the current from source 2 divided by its transformer 5 turns ratio. Thus is developed across each burden resistor 9A or 9B a voltage proportional to input current from source 2, which voltage may be used to represent the latter for measurement or control purposes. In this preferred embodiment each of burden resistors 9A or 9B has a value of 100 milli-ohms, each of which is reflected through the square of the turns ratio, typically 10, to contribute a one milli-ohm part to an imaginary shunt resistor between input terminals 3 and 4. Since the secondary winding S currents are typically much smaller than the input current from source 2, DPDT switches 11 can comprise smaller components and may be less complex than DPDT switches 10. The operation of secondary windings S and DPDT switches 11 is, however analogous to that of their previously described primary winding PR counterparts, save that each DPDT switch 11 is responsive to a commutation signal 21 for commutated element A, or 23 for commutated element B. commutation signals 21 and 23 are synchronous with commutation signals 20 and 22 respectively.

In this preferred embodiment, each transformer 5, is high frequency current transformer comprising a single-turn primary winding P, a ten-turn secondary winding S, and a manganese-zinc ferrite core F. Other numbers of turns, other turns ratios, and other core materials may be used to practice this invention. In this preferred embodiment, the commutation signals 20-23 are 50% duty-cycle square waves with a frequency between 50 KHz and 500 Khz. Other frequencies may be used to practice this invention and may be desirable for cores of other composition. For example, iron cores usually work well at lower frequencies, as do nickel-zinc ferrite cores at higher frequencies. It should be noted that commutated elements A and B, each comprising a switch 10, are in series circuit with each other and with input terminals 3 and 4. As is explained above, the resistance of burden resistor 9A or 9B of each commutated element is reflected to its primary winding PR through the square of the turns ratio of its transformer 5 and thence to input terminals 3 and 4. Each commutated element reflects about 1 milli-ohm of imaginary shunt resistance from its burden resistor 9A or 9B. Additionally each commutated element contributes about 2 milli-ohms from the resistance of its switch 10. Thus the total imaginary shunt resistance between terminals 3 and 4 is a little more than 6 milli-ohms. DPDT switches 11, each having about 10 milli-ohms of resistance, which is reflected through the square of the turns ratio as 100 micro-ohms, make but a minuscule contribution to the imaginary resistance seen between input terminals 3 and 4.

Figure 3:
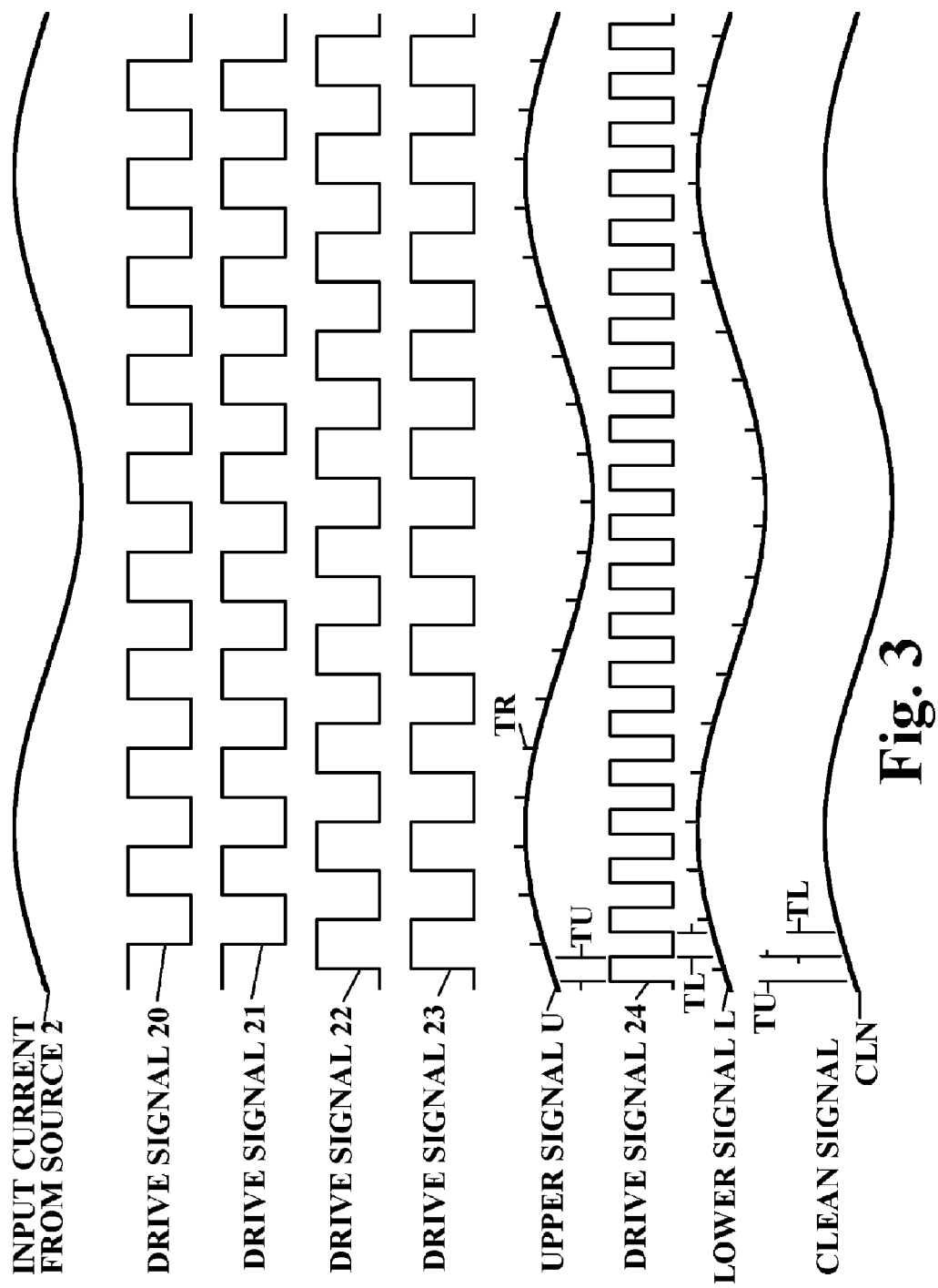
FIG. 3 shows waveforms occurring in the plural-element DCCT of FIG. 2.

FIG. 3 shows the waveforms of the plural commutated-element DCCT 1 of FIG. 2. At the top is depicted an input current waveform from source 2, which may be pure DC of either polarity, may be an AC waveform of arbitrary amplitude and harmonic content, or may be a combination of both DC and AC. Since the input current from source 2 is generated by an external circuit being measured, it may or may not be a sine wave as depicted in this figure.

Next are depicted commutation signals 20 and 21, which are synchronous and look alike, being separate only to achieve galvanic isolation as described above. These signals are typically square waves of 50% duty cycle. Below commutation signals 20 and 21 are depicted commutation signals 22 and 23, which are synchronous and look alike, being separated only to achieve galvanic isolation as described above. These also are typically square waves of 50% duty cycle. commutation signals 22 and 23 are out of phase with commutation signals 20 and 21.

Next is shown the upper signal that appears on line U of FIG. 2. This signal is somewhat marred by the superposition of transient disturbances resulting from the less than instantaneous commutation provided by DPDT switches 10 and 11, as described above. One typical such transient on this waveform is labeled TR, the remaining such transients not being so labeled to avoid clutter. Below the line U signal is shown a selector signal 24 which comprises an upper half-cycle time TU and a lower half-cycle time TL. Responsive to selector signal 24, during time TU SPDT selector switch 7 connects line U to terminal 13. As a result of this connection, the portion of clean signal CLN shown below is essentially identical to upper signal U during time TU. During time TU, lower signal L is marred by a transient disturbances resulting from the less than instantaneous commutation provided by commutated element B DPDT switches 10 and 11. However, during time TU SPDT selector switch 7 does not connect lower signal line L to terminal 13, so the "dirty" lower signal L does not appear in a clean signal CLN appearing on terminal 13. Also responsive to selector signal 24, during time TL SPDT selector switch 7 connects line L to terminal 13. As a result of this connection, the portion of clean signal CLN shown clean like signal L during time TL. During time TL, upper signal U is marred by a transient disturbance resulting from the less than instantaneous commutation provided by commutated element A DPDT switches 10 and 11. However, during time TL, SPDT selector switch 7 does not connect upper signal line U to terminal 13, so the "dirty" lower signal U does not appear in clean signal CLN.

Switching transient disturbances such as TR are typically less than 100 nS long and the half-cycles of selector signal 24 are typically many times 100 nS, so the phase difference between commutation signal set 20 and 21 and commutation signal set 22 and 23 need not be exactly 90 degrees as shown. For convenience, signals with 90 degree phase difference are very simple and easy to generate, as will be shown below.

Figure 4:
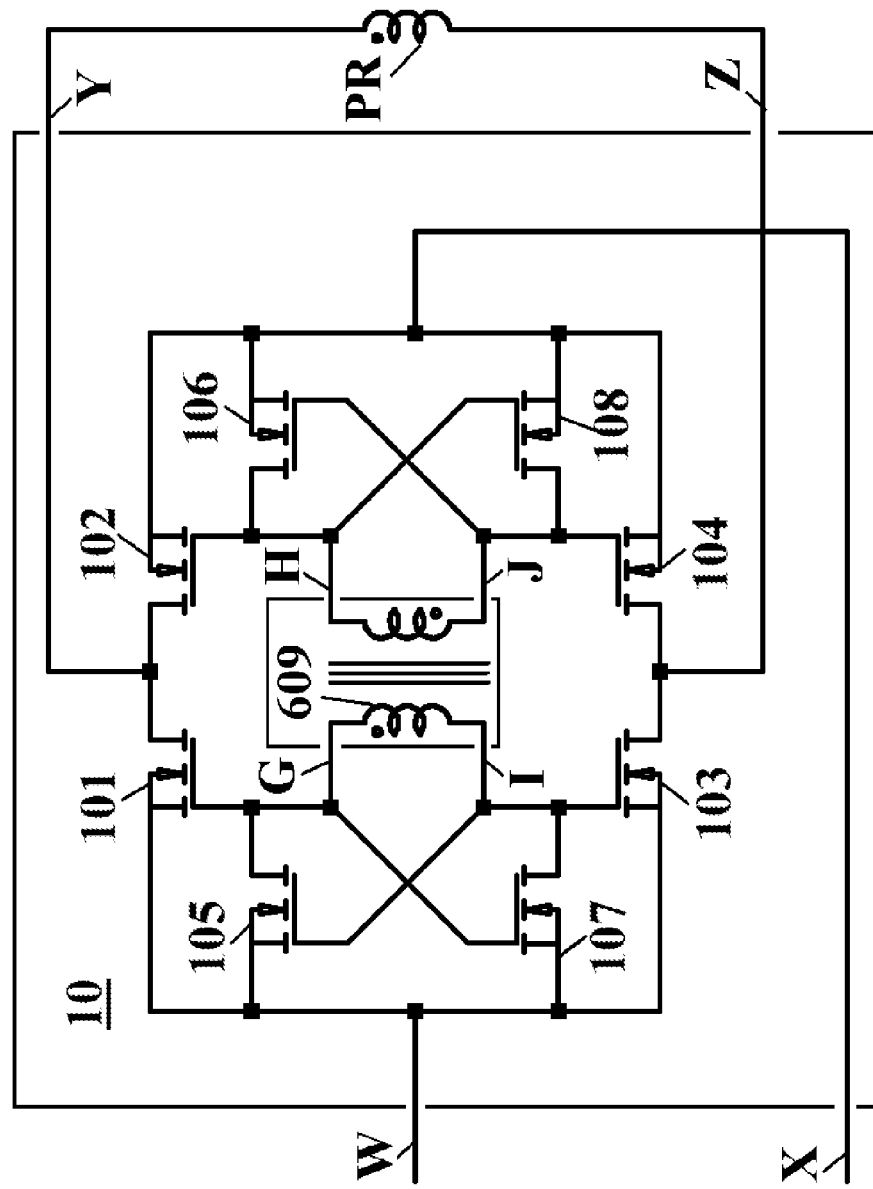
FIG. 4 shows a primary winding bridge-connected DPDT commutating switch.

FIG. 4 shows a bridge-connected DPDT switch 10. Switch 10 comprises four main MOSFETS 101-104, preferably Vishay part number SiR494, and four auxiliary MOSFETS 105-108, preferably Vishay part number Si4178. Switch 10 is provided with lines W and X, which allow it to be connected in series circuit with the current from source 2 of FIG. 2, as shown in FIG. 1. Switch 10 is also provided with lines Y and Z, which place it in series circuit with primary winding PR of transformer 5, as shown here and in FIG. 2. Switch 10 is also provided with lines G, H, I, and J which connect it to a transformer 609, through which it receives differential, galvanically isolated, commutation signals. Transformer 609 also has a primary winding, P1 and P2 of FIG. 6, and is comprised by a drive signal generator 6, to be discussed below. The commutation signals connected by lines G, H, I, and J correspond to the signal of line 20 of FIG. 2 for commutated element A, or to the signal of line 22 of FIG. 2 for commutated element B. These commutation signals preferably have a peak amplitude of about 8 volts.

When lines G and J are at about +8 volts, these voltages appear on the gates of, and enhance, MOSFET's 101 and 104. If we assume line W to be a current source, current will then flow from line W, through MOSFET 101, thence clockwise through line Y and primary winding P, thence through MOSFET 104 to line X. When, responsive to signal 20 or 22, lines H and I rise to about +8 volts lines G and J are near 0 volts. In this state, these voltages appear on the gates of, and enhance, MOSFET's 102 and 103. In this state, current from line X flows through MOSFET 103, thence counter-clockwise through line an AC voltage and primary winding P, thence through MOSFET 102 to line X. So we see that when the current from line W to line X has a given direction, the direction in which it flows through primary winding PR is reversed by DPDT switch 10 responsive to the signal of either line 20 or 22 of FIG. 2. This is the mechanism of commutation.

Because of the large currents in the primary winding PR, and the need to minimize the resistance between terminals 3 and 4 of FIG. 2, MOSFET's 101-104 may be large and capacitive, and may require considerable gate current to be turned OFF promptly. To facilitate fast gate discharge DPST switch 10 comprises smaller MOSFET's 105-108 each of which can, when ON, essentially short-circuit the gate and source of the MOSFET to which its drain and source are connected. Thus MOSFET's 105, 106, 107, and 108 discharge the gates of MOSFET's 101, 102, 103, and 104, respectively, all responsive to to the signal of either line 20 or 22 of FIG. 2. The gates of MOSFET's 105, 106, 107, and 108 are driven oppositely to the gates of MOSFET's 101, 102, 103, and 104, respectively, i.e. the gate of MOSFET 105 is near 0 when the gate of MOSFET 101 is near +8 volts.

It should be noted that most MOSFET's having body diodes are nonetheless bipolar blocking (non-conducting in either direction when not enhanced) at voltages below one diode-drop. Since a DCCT is a form of current transformer having a burden resistor that keeps voltages across the transformer very low, MOSFET's 101-104 are subjected to very small voltages, and thus can function as bipolar-blocking switches. It is this bipolar-blocking function that allows input current of either polarity from source 2 of FIG. 2 to be commutated by this circuit. Were this circuit used as a voltage transformer instead of a current transformer, the higher voltages encountered would restrict commutation to input of a single polarity.

Figure 5:
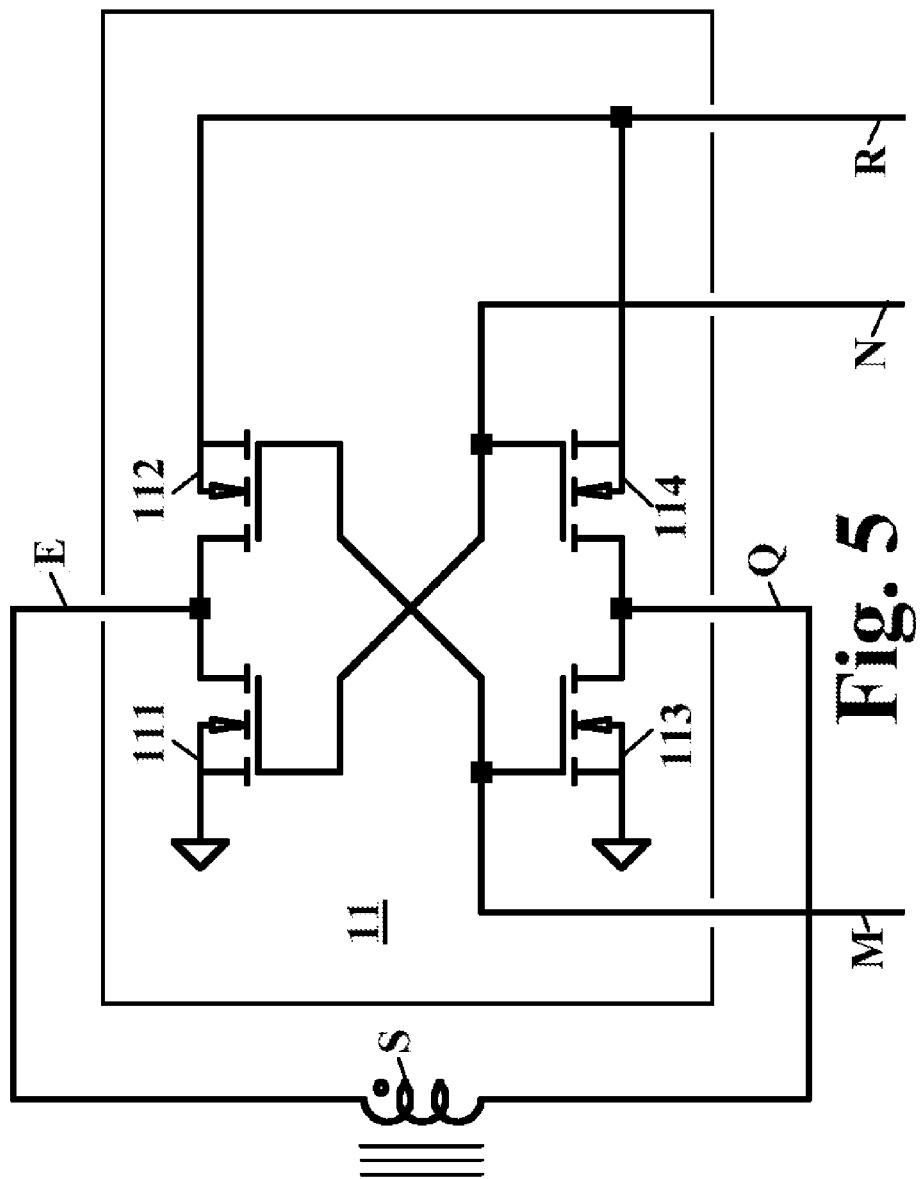
FIG. 5 shows a secondary winding bridge-connected DPDT commutating switch.

FIG. 5 depicts a bridge-connected DPDT switch 11 in greater detail than is shown in FIG. 2. Switch 11 comprises four MOSFET's 111-114 which operate analogously to, and synchronously with, MOSFET's 101-104 of the switch 10 of the commutated element comprising this switch 11. Gate discharge MOSFET's are not needed in switch 11 because smaller and less capacitive MOSFET's may be selected for MOSFET's 111-114. This selection is because MOSFET's 111-114 conduct only secondary winding S currents, which are much smaller than the primary winding PR currents that flow in FIG. 4.

Switch 11 operates as follows:

Assuming that at a given time secondary winding S is sourcing current through line E and MOSFET's 112 and 113 are being enhanced by an approximately +10 volt signal on line M, responsive to line 21 or 23 of FIG. 2 driving commutated element A or B respectively. This current flows clockwise through MOSFET 112, and through line R which connects to burden resistor 9A or 9B of commutated element A or B respectively. This current develops across that burden resistor a voltage proportional to the input current from source 2 of FIG. 1, as explained above for FIG. 2. Passing through that burden resistor, the current is conducted through a common line to MOSFET 113, which conducts it to line Q, through which it returns to secondary winding S. At this time MOSFET's 111 and 114 are OFF due to an approximately 0 volts on line N, responsive to line 21 or 23 of FIG. 2 driving commutated element A or B respectively. When, responsive to line 21 or 23 of FIG. 2, and simultaneously with the commutation of switch 10 of FIG. 2 of the same commutated element, lines M and N transition to opposite states, MOSFET's 112 and 113 turn OFF and MOSFET's 111 and 114 turn on. Due to the just cited commutation of switch 10, the current in secondary winding S simultaneously reverses, now sourcing current through line Q. Current from line Q now flows through MOSFET 114, thence through line R into and through burden resistor 9A or 9B of commutated element A or B respectively. In that resistor it develops a voltage of the same polarity as was just developed prior to the commutation of switch 10 of FIG. 2 of the same commutated element. From that burden resistor the current flows through the common terminal, through MOSFET 111, thence through line E, to return to secondary winding S. Thus one can see that just as the commutation of a switch 10 can, from a DC current, produce AC current in a primary winding PR of transformer 5, commutation of a corresponding switch 11 can turn an induced current in a corresponding secondary winding S back into a DC current in a corresponding burden resistor. Thus with a DC input current from source 2, there is developed across both burden resistors 9A and 9B a DC voltage proportional to that DC input current, and corresponding to the polarity thereof.

Figure 6:
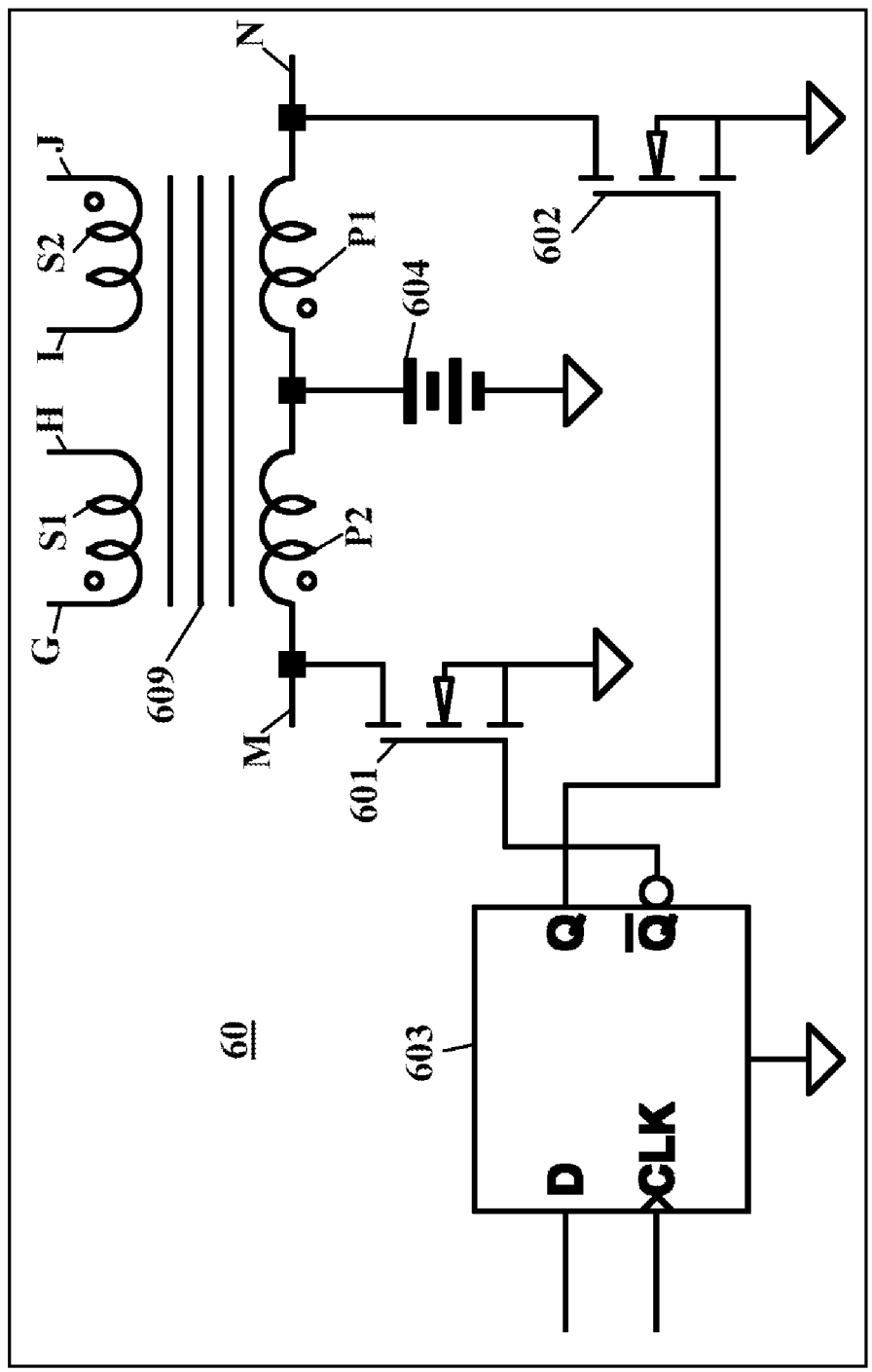
FIG. 6 shows a drive interface circuit comprised by a drive generator.

FIG. 6 shows a driver interface 60, omitted for clarity in FIGS. 1 and 2, and comprised by a drive generator 6 to be illustrated and discussed below. A flip-flop 603, typically one-half of a type 74AC74 dual type D flip-flop integrated circuit, receives a clock and data signal from other driver generator 6 circuitry to be discussed below and generates on its Q and /Q terminals signals of opposite phases. When a logic 1 has been clocked into a flip-flop 603, a logic 1, preferably +5 volts, appears on its Q terminal and 0 volts appears on its /Q terminal. MOSFET 602 then conducts and MOSFET 601 is off. Current then flows from voltage source 604, preferably +5 volts, through a winding P1 of transformer 609, previously cited in FIG. 4, through MOSFET 602, through the common line, and back to source 604. Thus a positive voltage is applied to the dot of winding P1 of transformer 609, and a positive voltage is induced to appear at the dotted end of each other winding, P2, S1, and S2, of transformer 609, each relative to its undotted winding end. Thus 0 volt occurs at line N, +5 volts at the dotted end of winding P1, and +10 volts at line M. Lines M and N drive an associated switch 11 as shown in FIG. 5, and are differential halves comprised by either signal 21 or 23 shown driving commutated elements A and B of FIG. 1 respectively. Voltages are also induced into secondary windings S1 and S2 which, with switch 602 on, positive on lines G and H relative to lines I and J, these lines previously having been cited in FIG. 4, these line being galvanically isolated by transformer 609 from lines M and N and from each other. Lines G-J carry a set of two differential signals comprised by signal 20 or signal 22 of commutated element A or B respectively of FIG. 1. It should be noted that transformer 609 is a voltage transformer of ordinary character intended to convey and isolate voltage control signals, and is not a current transformer like transformer 5 of elements A and B of FIG. 2.

Figure 7:
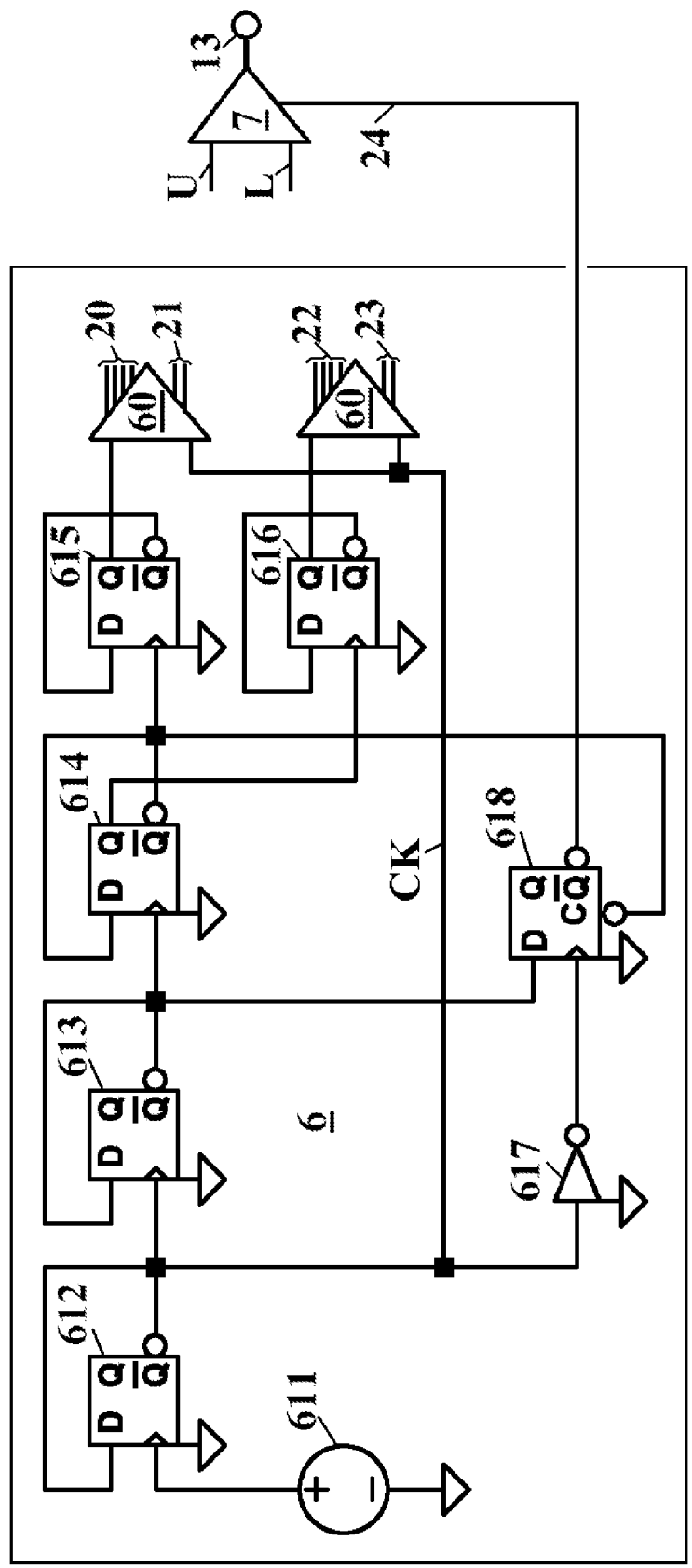
FIG. 7 shows a commutation and selector signal drive generator and an SPDT selector switch.

FIG. 7 shows in more detail the drive generator 6 shown in FIG. 2. A signal source 611 has its frequency divided by 2 by flip-flop 612 to provide a clock signal CK. Signal CK is further divided by 2 by flip-flop 613, and again divided by 2 by flip-flop 614, the latter providing a non-inverted Q output and an inverted /Q output. The inverted output is again divided by 2 by flip-flop 615 to provide at its Q output the necessary data signal for upper driver interface 60 to produce composite signals 20 and 21 for commutated element A as described for FIG. 6. In like manner, the Q output of flip-flop 614 is divided by 2 by flip-flop 616 to provide at its Q output the necessary data signal for lower driver interface 60 to produce composite signals 22 and 23 for commutated element B as described for FIG. 6. Since the outputs of flip-flop 614 are twice the frequency of those of flip-flops 615 and 616, and the outputs of flip-flop 614 are mutually out of phase, the outputs of flip-flops 615 and 616 are mutually out of phase by 90 degrees. The signal CK also clocks both upper and lower driver interfaces 60. Inverter 617 inverts the signal CK to clock flip-flop 618, the data feeding which emanates from the /Q output of flip-flop 613, to produce the selector signal 24. Flip-flop 614 is cleared by the /Q output of flip-flop 614 correctly to produce selector signal 24 as shown in FIG. 3. All these flip-flops are preferably halves of is type 74HC74 or type 74AC74.

FIG. 7 also shows selector switch 7 in more detail, selecting the output to be fed to terminal 13 from signals U and L, responsive to selector signal 24. Selector switch 7 is preferably Texas Instruments type TS5A3167, which typically turns ON about 2 nS more quickly than it turns off. Thus when selector switch 7 switches it is very likely that both signals U and L will be connected to terminal 13 for a few nanoseconds. Since this switching occurs when both signals are "clean" and when both have the same potential, this simultaneous conduction is beneficial in that it avoids a short time period when terminal 13 might not be connected to either signal U or signal L.

It should be understood that with correctly chosen burden resistors 9A and 9B, and with well chosen MOSFET's, the voltages occurring between MOSFET drains and sources are, in this embodiment of the present invention, significantly less than one silicon PN diode-drop of about 600 mV. It is commonly understood that because of the connection of their body diodes to their source terminals, most MOSFET's usually block current flow only unilaterally in their OFF state. What is less widely understood, however, is that below one diode-drop the same MOSFET's bilaterally block in their OFF state and bilaterally conduct in their ON state. Thus, in this embodiment with its low drain to source voltages, such usually unipolar blocking MOSFET's suffice for bipolar operation, that is operation with both DC and AC inputs and outputs.

It should be understood that either N-channel MOSFET's, P-channel MOSFET's, or combinations of both may be applied to practice this invention, as may NPN and PNP BJT's, or combinations of the above.

What is claimed is:

1. A direct-current current transformer (DCCT) comprising;
    first and second input terminals for connecting an input current to be measured to the DCCT,
    an output terminal for connecting an output signal representing the input current to external measurement or control apparatus,
    a drive signal generator for generating a commutation signal of a first phase, a commutation signal of a second phase, and a selector signal,
    a first commutated element for producing a current representing the input current comprising,
        a first current transformer comprising a primary winding and a secondary winding and,
        a first commutating switch connected in a first series circuit with the first input terminal and with the primary winding of the first current transformer, for commutating the input current in the primary winding of the first current transformer responsive to the commutation signal of the first phase to induce into the secondary winding of the first current transformer a current representing the input current,
    a first burden connected in series circuit with the secondary winding of the first current transformer to develop a first signal representing to the input current,
    a second commutated element for producing a current representing the input current comprising,
        a second current transformer comprising a primary winding and a secondary winding and,
        a second commutating switch connected in a second series circuit with the second input terminal and with the primary winding of the second current transformer, for commutating the input current in the primary winding of the second current transformer responsive to the commutation signal of the second phase to induce into the secondary winding of the second current transformer a current representing the input current,
    a second burden connected in series circuit with the secondary winding of the second current transformer to develop a second signal representing the input current,
    the first series circuit of the first commutated element being connected in series circuit with the second series circuit of the second commutated element and with the input terminals,
    and a selector switch responsive to the selector signal for connecting the output terminal, responsive to the selector signal, to either,
        the first signal representing the input current to avoid conducting to the output terminal transient disturbances on the second signal representing the input current, or to,
        the second signal representing the input current to avoid conducting to the output terminal transient disturbances on the first signal representing the input current, whereby,
    the signal appearing at the output terminal represents the input current without transient disturbances.

2. The DCCT of claim 1, wherein each commutated element comprises an additional commutating switch in series circuit with its current transformer secondary winding and with the burden connected thereto, for restoring to the current flowing in the burden the spectral components necessary to permit that current, and thus any signal generated by the burden, to represent the spectral composition of the current flowing through the input terminals of the DCCT.

3. The DCCT of claim 1 wherein the input terminals are galvanically isolated from the output terminal to avoid substantial metallic or ionic electrical conduction between the input terminals and the output terminal.

4. The DCCT of claim 1 wherein either or both the commutation signal of the first phase and the commutation signal of the second phase comprise one or more pairs of differential signals.

5. The DCCT of claim 1 further comprising one or more voltage transformers for conveying and conditioning the commutation signal of the first phase, the commutation signal of the second phase, or plural commutation signals to the commutated elements.

6. The method of operating a plural commutating-element direct-current current-transformer (DCCT) comprising the steps of,
    commutating, responsive to a first commutating signal of a first phase, an input current into a first primary winding of a first current transformer to induce into a first secondary winding a current representing the input current,
    connecting a burden in circuit with the first secondary winding to generate a first signal representing the input current,
    commutating, responsive to a second commutating signal of a second phase, an input current into a second primary winding of a second current transformer to induce into a second secondary winding a current representing the input current,
    connecting a burden in circuit with the second secondary winding to generate a second signal representing the input current,
    selectively connecting, responsive to a selector signal, to an output terminal, either to,
        the first signal representing the input current to avoid transient disturbances occurring in the second signal representing the input current, or to,
        the second signal representing the input current to avoid transient disturbances occurring in the first signal representing the input current, thereby
    conducting to the output terminal a signal representing the input current free of transient disturbances.

7. The method of claim 6 of operating a plural commutated-element DCCT, further comprising the step of,
commuting the current induced into a secondary winding of a current transformer into an associated burden to restore to the current in that burden the spectral components necessary to permit that current, and thus any signal generated by the burden, to represent the spectral composition of the current flowing through the input terminals of the DCCT.

* * * * *